(12) United States Patent
Okushima

(10) Patent No.: US 9,712,165 B2
(45) Date of Patent: Jul. 18, 2017

(54) SEMICONDUCTOR DEVICE INCLUDING ELECTROSTATIC PROTECTION CIRCUIT

(75) Inventor: Mototsugu Okushima, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 87 days.

(21) Appl. No.: 13/032,333

(22) Filed: Feb. 22, 2011

(65) Prior Publication Data

US 2011/0205673 A1    Aug. 25, 2011

(30) Foreign Application Priority Data

Feb. 23, 2010  (JP) ................. 2010-037598

(51) Int. Cl.
*H02H 9/00* (2006.01)
*H03K 19/003* (2006.01)

(52) U.S. Cl.
CPC .................. *H03K 19/003* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 5,910,675 | A * | 6/1999 | Horiguchi et al. | 257/370 |
| 6,075,686 | A * | 6/2000 | Ker | 361/56 |
| 7,112,852 | B2 * | 9/2006 | Okushima | 257/360 |
| 7,352,547 | B2 * | 4/2008 | Okushima | 361/56 |
| 7,362,555 | B2 * | 4/2008 | Wu | H02H 9/046 361/111 |
| 7,817,386 | B2 * | 10/2010 | Ker et al. | 361/56 |
| 8,283,728 | B2 * | 10/2012 | Okushima | H01L 27/0266 257/358 |
| 8,315,024 | B2 * | 11/2012 | Russ et al. | 361/56 |

(Continued)

FOREIGN PATENT DOCUMENTS

| JP | H08-227971 | 9/1996 |
|---|---|---|
| JP | 2008-218886 | 9/2008 |

(Continued)

OTHER PUBLICATIONS

Y. Morishita et al., "A Low-Leakage SCR Design Using Trigger-PMOS Modulations for ESD Protection", 2007, EOS/ESD Symposium Proceedings, pp. 07-376 to 07-384.

(Continued)

*Primary Examiner* — Ronald W Leja
(74) *Attorney, Agent, or Firm* — Young & Thompson

(57) ABSTRACT

A semiconductor device includes: a first power source (PS1) pad supplied with a PS1 voltage; a PS1 line connected to the PS1 pad; a first ground line (G1); an output circuit operated using the PS1 voltage; a second power source (PS2) pad supplied with a PS2 voltage; a PS2 line connected to the PS2 pad; a second ground line (G2); a signal line connected to an output end of the output circuit; an input circuit connected to the signal line at an input end receiving a signal from the output end and operated using the PS2 voltage; a main protection circuit unit providing discharge routes between the PS1 pad and G1, G1 and G2, and G2 and the PS2 pad; and a sub protection circuit unit. The output circuit includes: a circuit element arranged between the PS1 line and the signal line and able to function as a resistive element.

20 Claims, 17 Drawing Sheets

(56) References Cited

U.S. PATENT DOCUMENTS

| | | | |
|---|---|---|---|
| 8,625,239 B2* | 1/2014 | Okushima | H01L 23/60 361/56 |
| 2003/0133237 A1* | 7/2003 | Hung et al. | 361/56 |
| 2007/0047162 A1* | 3/2007 | Watanabe | H01L 27/0266 361/56 |
| 2008/0062597 A1* | 3/2008 | Chen et al. | 361/56 |
| 2008/0217650 A1 | 9/2008 | Morishita | |
| 2008/0285190 A1* | 11/2008 | Okushima | 361/56 |
| 2011/0205673 A1* | 8/2011 | Okushima | H03K 19/003 361/56 |

FOREIGN PATENT DOCUMENTS

| | | |
|---|---|---|
| JP | 2009-026008 | 2/2009 |
| JP | 2009-260082 | 11/2009 |

OTHER PUBLICATIONS

Japanese Official Action—2010-037598—Nov. 25, 2013.

* cited by examiner

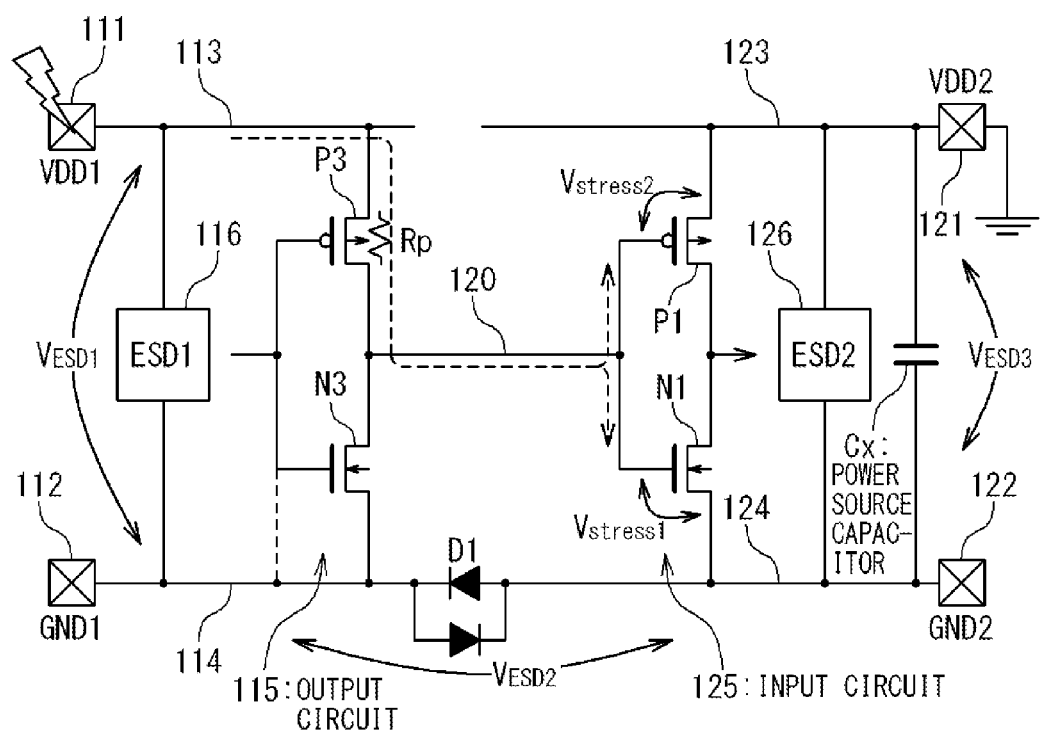

US 9,712,165 B2

SEMICONDUCTOR DEVICE INCLUDING ELECTROSTATIC PROTECTION CIRCUIT

INCORPORATION BY REFERENCE

This application is based upon and claims the benefit of priority from Japanese patent application No. 2010-037598 filed on Feb. 23, 2010, the disclosure of which is incorporated herein in its entirety by reference.

BACKGROUND OF THE INVENTION

1. Field of the Invention

The present invention relates to a semiconductor device, and more particularly relates to a configuration of an electrostatic protection circuit.

2. Description of Related Art

There is a case that a semiconductor device is configured such that a plurality of circuits each having a different power source system for supplying a power source voltage is integrated in the identical chip. In such a case, typically, a plurality of power source pads to which the power source voltages are respectively supplied from the different power source systems and a plurality of ground pads which is arranged correspondingly to the plurality of power source pads, respectively, are arranged in the semiconductor device.

Also, the semiconductor device typically includes an electrostatic protection circuit for protecting an internal circuit from an ESD (electrostatic discharge) surge applied to an external pad. As mentioned above, in the semiconductor device in which the plurality of circuits each having the different power source voltage is integrated in the identical chip, an ESD protection element is connected between the power source pad and the ground pad in a pair of the power source pad and the ground pad. Thus, the internal circuit is protected from the ESD surge.

FIG. 1A is a circuit diagram showing an example of a typical configuration of the semiconductor device which includes a plurality of circuits each having a different power source system and electrostatic protection circuits for protecting the plurality of circuits. The semiconductor device in FIG. 1A includes a first power source pad 111, a first ground pad 112, a first power source line 113, a first ground line 114, an output circuit 115, a second power source pad 121, a second ground pad 122, a second power source line 123, a second ground line 124 and an input circuit 125. The output circuit 115 includes a PMOS transistor P3 and an NMOS transistor N3, as output transistors. The input circuit 125 includes a PMOS transistor P1 and an NMOS transistor N1. The output circuit 115 and the input circuit 125 configure an interface for transmitting a signal between circuits to which the power source voltages are supplied from the different power source systems, and are connected through a signal line 120.

When a usual operation is carried out, a first power source voltage VDD1 is supplied to the first power source pad 111, and a ground voltage is supplied to the first ground pad 112. The output circuit 115 and an internal circuit (not shown) connected thereto are operated at the first power source voltage VDD1. On the other hand, a second power source voltage VDD2 is supplied to the second power source pad 121, and the ground voltage is supplied to the second ground pad 122. The input circuit 125 and an internal circuit (not shown) connected thereto are operated at the second power source voltage VDD2.

ESD protection elements 116 and 126 and a protection diode pair D1 are arranged for the protection against the ESD surge. The ESD protection element 116 is connected between the first power source line 113 and the first ground line 114, and the ESD protection element 126 is connected between the second power source line 123 and the second ground line 124. The protection diode pair D1 is arranged between the first ground line 114 and the second ground line 124. At the time of the usual operation, the first ground line 114 and the second ground line 124 are electrically separated by the protection diode pair D1. When the ESD surge is applied to the first power source pad 111, the first ground pad 112, the second power source pad 121 and the second ground pad 122, the ESD protection elements 116 and 126 and the protection diode pair D1 serve as a route for discharging the ESD surge and consequently have a role for protecting the output circuit 115, the input circuit 125 and the other circuits.

The typical element used as the ESD protection elements 116 and 126 are off transistors. The off transistor implies a MOS transistor in which a potential of a gate is fixed such that the transistor is turned off at the time of the usual operation. Then, the ESD surge is discharged by a parasitic bipolar operation. Typically, when a NMOS transistor is used as the off transistor, a drain of the NMOS transistor is connected to the power source line, and a source and a gate of the NMOS transistor are connected to the ground line. On the other hand, when a PMOS transistor is used as the off transistor, a drain of the PMOS transistor is connected to the ground line, and a gate and a source of the PMOS transistor are connected to the power source line. In the off transistor, when the ESD surge is applied to its drain, the ESD surge is discharged by the parasitic bipolar operation. With the foregoing principle, the off transistor effectively functions as the ESD protection element.

In the circuit configuration shown in FIG. 1A, a breakdown mode noted by the inventor is a breakdown mode when the ESD surge is applied between the pads mutually belonging to the power source system. When an external circuit is not connected to the first power source pad 111, the first ground pad 112, the second power source pad 121 and the second ground pad 122 so that the power source voltage is not supplied, the gates of the PMOS transistor P3 and the NMOS transistor N3 are floating. Thus, there is a case that the PMOS transistor P3 or NMOS transistor N3 is turned on.

In such a situation, between the first power source pad 111 and the second ground pad 122, when the ESD surge with positive polarity relative to the second ground pad 122 as a reference is applied to the first power source pad 111 as shown in FIG. 1A, a stress voltage $V_{stress1}$ is applied between the gate and the source of the NMOS transistor N1 in the input circuit 125 through the first power source line 113, the PMOS transistor P3 and the signal line 120. This stress voltage $V_{stress1}$ is considerably high because the stress voltage $V_{stress1}$ becomes the sum of a clamp voltage $V_{ESD1}$ of the ESD protection element 116 and a clamp voltage $V_{ESD2}$ of the protection diode pair D1. Thus, there is a possibility that the NMOS transistor N1 is broken.

Also, as shown in FIG. 1B, between the first power source pad 111 and the second power source pad 121, when the ESD surge with positive polarity relative to the second power source pad 121 as a reference is applied to the first power source pad 111, the stress voltage $V_{stress1}$ is applied between the gate and the source of the NMOS transistor N1 and a stress voltage $V_{stress2}$ is applied between the gate and the source of the PMOS transistor P1 in the input circuit 125 through the first power source line 113, the PMOS transistor P3 and the signal line 120. At this time, the stress voltage $V_{stress1}$ applied to the NMOS transistor N1 becomes the sum of the clamp voltage $V_{ESD1}$ of the ESD protection element 116 and the clamp voltage $V_{ESD2}$ of the protection diode pair D1. Also, the stress voltage $V_{stress2}$ applied to the PMOS transistor P1 becomes the sum of the foregoing clamp voltages $V_{ESD1}$ and $V_{ESD2}$ and a clamp voltage $V_{ESD3}$ of the ESD protection element 126. Therefore, both of the stress voltages $V_{stress1}$ and $V_{stress2}$ are considerably high. Thus, there is a possibility that the NMOS transistor N1 and the PMOS transistor P1 are broken.

Moreover, the case that the ESD surge with positive polarity relative to the first power source pad 111 as a reference is applied to the second power source pad 121 between the second power source pad 121 and the first power source pad 111 and the case that the ESD surge with positive polarity relative to the first ground pad 112 as a reference is applied to the second power source pad 121 between the second power source pad 121 and the first ground pad 112 are also similar to the above described cases. When the ESD surge with positive polarity relative to the first power source pad 111 as a reference is applied to the second power source pad 121, the stress voltage $V_{stress1}$ applied to the NMOS transistor N1 becomes the sum of the clamp voltages $V_{ESD1}$ and $V_{ESD2}$. Also, the stress voltage $V_{stress2}$ applied to the PMOS transistor P1 becomes the sum of the clamp voltages $V_{ESD1}$, $V_{ESD2}$ and $V_{ESD3}$. Therefore, both of the stress voltages $V_{stress1}$ and $V_{stress2}$ are considerably high. Thus, there is a possibility that the NMOS transistor N1 and the PMOS transistor P1 are broken. In addition, when the ESD surge with positive polarity relative to the first ground pad 112 as a reference is applied to the second power source pad 121, the stress voltage $V_{stress2}$ applied to the PMOS transistor P1 becomes the sum of the clamp voltages $V_{ESD2}$ and $V_{ESD3}$, and there is a possibility that the PMOS transistor P1 is broken.

According to the consideration of the inventor, it is important to protect the NMOS transistor N1 and the PMOS transistor P1 from being broken by the foregoing breakdown mode.

In particular, when the off transistors are used as the ESD protection elements 116 and 126, the problem of the increase in the stress voltages $V_{stress1}$ and $V_{stress2}$ applied between the gates and the sources of the NMOS transistor N1 and the PMOS transistor P1, respectively, becomes severe. This is because in recent years, in association with advancements of miniaturization of MOS transistors, although a breakdown voltage $V_{BD}$ of a MOS transistor is decreased, an operational voltage (clamp voltage $V_{clamp}$) at which a parasitic bipolar operation is executed is not decreased. FIG. 2 is a graph showing a relation between a breakdown voltage $V_{BD}$ of a gate insulation film and a clamp voltage $V_{clamp}$ when a NMOS transistor carries out a parasitic bipolar operation (a voltage while discharge caused by the parasitic bipolar operation is carried out). Although the breakdown voltage $V_{BD}$ is sharply decreased together with a reduction in a film thickness of the gate insulation film, the clamp voltage $V_{clamp}$ is not decreased. This implies that in association with the advancements of the miniaturization of the MOS transistors, although the breakdown voltages $V_{BD}$ of the NMOS transistor N1 and the PMOS transistors P1 are decreased, the operational voltages at which the ESD protection elements 116 and 126 are operated are not decreased, which implies that a design window is made small.

As one method for solving the foregoing problem, a circuit configuration is known in which a thyristor is used as the ESD protection element and a trigger current is supplied by a triggering element operated at a low voltage (refer to a patent literature 1 and a non-patent literature 1). When a PMOS transistor that carries out a usual MOS operation to supply the trigger current is used as the triggering element, it is possible to decrease the operational voltage of the ESD protection element.

Patent Literature 1: Japanese Patent Publication No. JP-P 2008-218886A (corresponding to US Patent Publication No. US2008217650A1)

Non-Patent Literature 1: Y. Morishita et al., "A Low-Leakage SCR Design Using Trigger-PMOS Modulation for ESD Protection", 2007 EOS/ESD Symposium Proceedings, 2007376.

However, the inventor has now discovered the following facts. According to the consideration of the inventor, the problem of the breakdown of the NMOS transistor N1 and the PMOS transistor P1 in the circuit configuration of FIGS. 1A and 1B cannot be solved only by decreasing the operational voltage of the ESD protection element. Specifically, in the circuit configurations of FIGS. 1A and 1B, when the ESD surge is applied, the stress voltage $V_{stress1}$ or $V_{stress2}$ is applied without change between the gate and the source of the NMOS transistor N1 or PMOS transistor P1 that is the element targeted for the protection. Thus, if the ESD protection elements 116 and 126 and the protection diode pair D1 do not function sufficiently, there is a possibility that the NMOS transistor N1 or PMOS transistor P1 is broken by applying the stress voltages $V_{stress1}$, $V_{stress2}$ between the source and the gate. The foregoing problem is not solved even if the ESD protection element having the above configuration, in which the PMOS transistor for carrying out the usual MOS operation is used to supply the trigger current to the thyristor, is used to reduce the operational voltage.

SUMMARY

The present invention seeks to solve one or more of the above problems, or to improve upon those problems at least in part.

In one embodiment, a semiconductor device includes: a first power source pad configured to be supplied with a first power source voltage; a first power source line configured to be connected to the first power source pad; a first ground line; an output circuit configured to be operated using the first power source voltage; a second power source pad configured to be supplied with a second power source voltage; a second power source line configured to be connected to the second power source pad; a second ground line; a signal line configured to be connected to an output end of the output circuit; an input circuit configured to be connected to the signal line at an input end to receive a signal from the output end, and be operated using the second power source voltage; a main protection circuit unit configured to provide discharge routes between the first power source pad and the first ground line, between the first ground line and the second ground line, and between the second ground line and the second power source pad; and a sub protection circuit unit, wherein the output circuit includes: a circuit element configured to be arranged between the first power source line and the signal line and be able to function as a resistive element, and wherein the sub protection circuit unit includes: a first PMOS transistor configured to be connected to the signal line at a source, be connected to the second ground line at a drain and be connected to the second power source line at a gate and a back gate.

In another embodiment, a semiconductor device includes: a first power source pad configured to be supplied with a first power source voltage; a first power source line configured to be connected to the first power source pad; a first ground line; an output circuit configured to be operated using the first power source voltage; a second power source pad configured to be supplied with a second power source voltage; a second power source line configured to be connected to the second power source pad; a second ground line; a signal line configured to be connected to an output end of the output circuit; an input circuit configured to be connected to the signal line at an input end to receive a signal from the output end, and be operated using the second power source voltage; a main protection circuit unit configured to provide discharge routes between the first power source pad and the first ground line, between the first ground line and the second ground line, and between the second ground line and the second power source pad; and a sub protection circuit unit, wherein the output circuit includes: a circuit element configured to be arranged between the first power source line and the signal line and be able to function as a resistive element, and wherein the sub protection circuit unit includes: a first NMOS transistor configured to be connected to the signal line at a source, be connected to the second power source line at a drain and be connected to the second ground line at a gate and a back gate.

According to the present invention, in the semiconductor device that the output circuit and input circuit, which are supplied with their power source voltages from the different power source systems, are connected, the breakdown of the input circuit caused by applying the ESD surge voltage without change (as it is) to the input circuit through the output circuit can be effectively suppressed.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1B is a circuit diagram showing an operation of the semiconductor device in FIG. 1A when an ESD surge is applied;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1A:
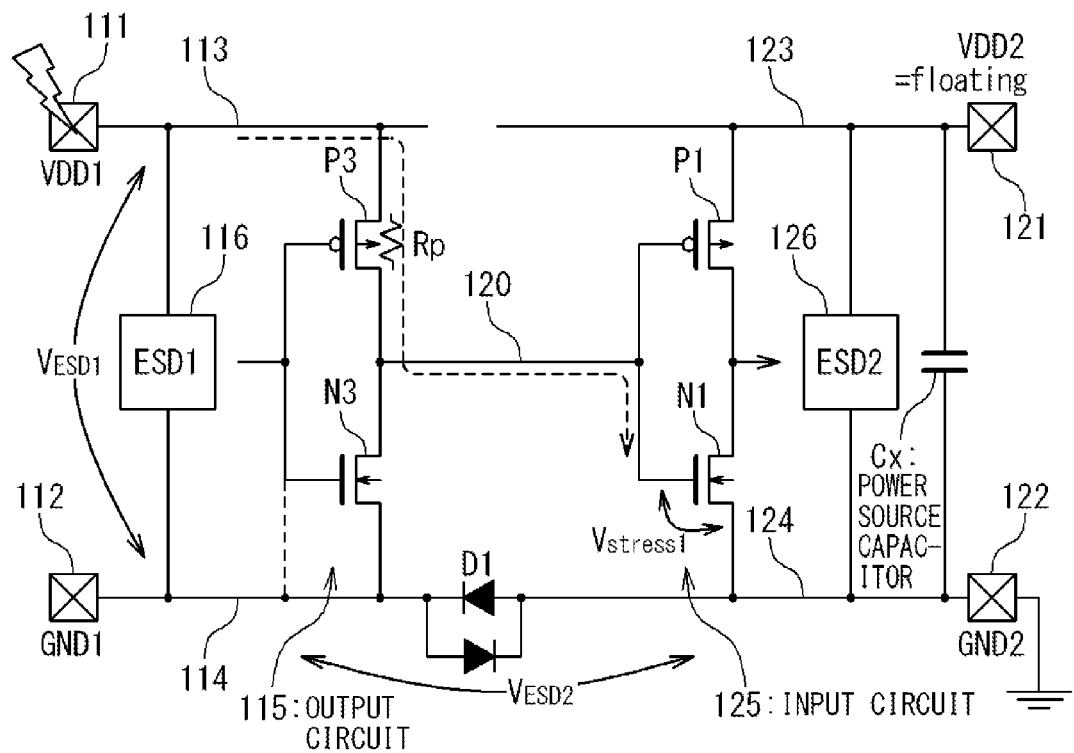
FIG. 1A is a circuit diagram showing an example of a typical configuration of a semiconductor device on which an electrostatic protection circuit is mounted.
Figure 2:
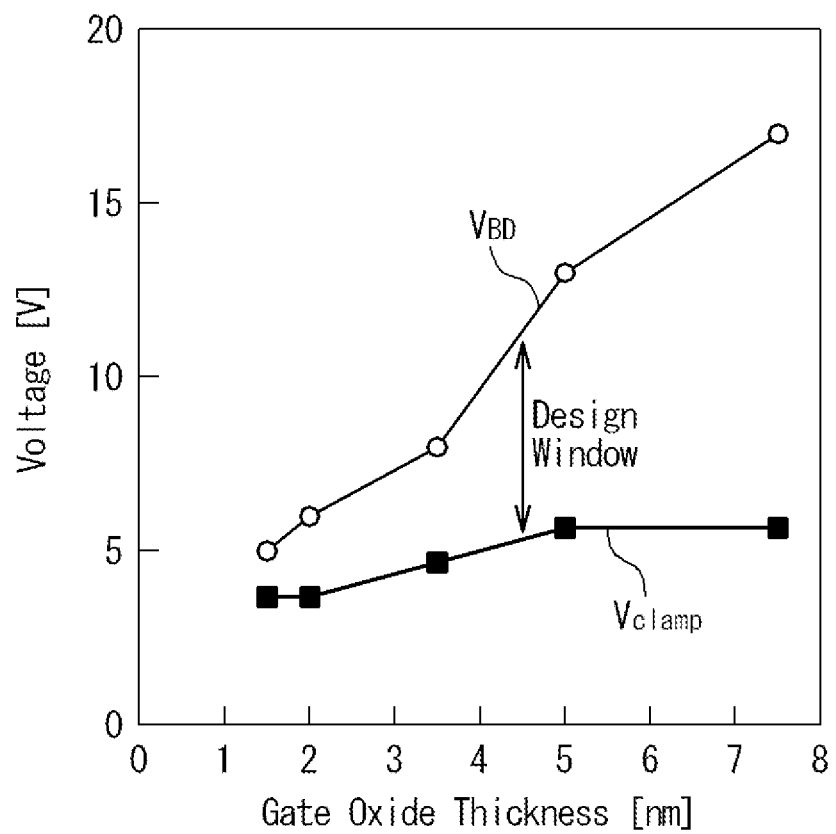
FIG. 2 is a graph showing a relation between a breakdown voltage $V_{BD}$ of a gate insulation film and a clamp voltage $V_{clamp}$ when an NMOS transistor carries out a parasitic bipolar operation.
Figure 3:
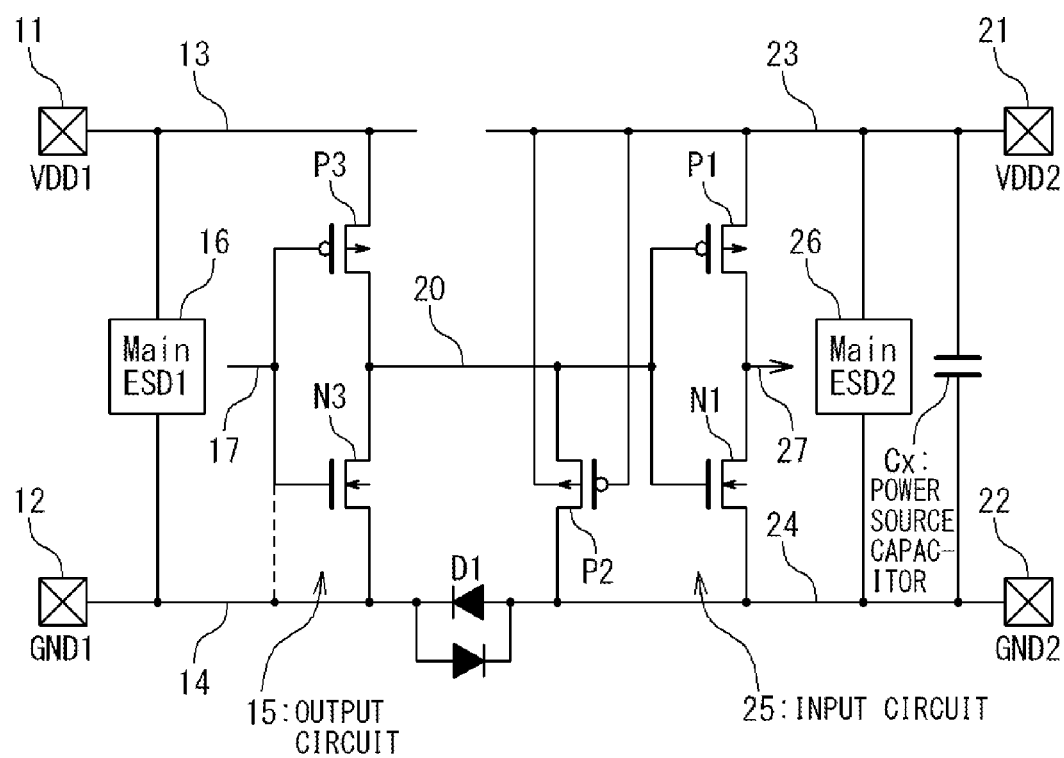
FIG. 3 is a circuit diagram showing a configuration of a semiconductor device in a first embodiment of the present invention.

FIG. 3 is a circuit diagram showing a configuration of a semiconductor device in the first embodiment of the present invention, especially, a configuration of an electrostatic protection circuit integrated in the semiconductor device. The semiconductor device in this embodiment includes a first power source pad 11, a first ground pad 12, a first power source line 13, a first ground line 14, an output circuit 15, a second power source pad 21, a second ground pad 22, a second power source line 23, a second ground line 24 and an input circuit 25.

When the usual operation is carried out, the first power source voltage VDD1 is supplied to the first power source pad 11, and the ground voltage is supplied to the first ground pad 12. The output circuit 15 and an internal circuit (not shown) connected to the output circuit 15 are operated using the first power source voltage VDD1. On the other hand, the second power source voltage VDD2 is supplied to the second power source pad 21, and the ground voltage is supplied to the second ground pad 22. The input circuit 25 and an internal circuit (not shown) connected to the input circuit 25 are operated using the second power source voltage VDD2. Here, there is a case that the power source voltage VDD2 differs from the power source voltage VDD1. The output circuit 15 and the input circuit 25 configure an interface for transmitting a signal between circuits to which different power source voltages are supplied from different power source systems. An output end of the output circuit 15 is connected through a signal line 20 to an input end of the input circuit 25.

The output circuit 15 is the circuit for driving the signal line 20 to a desirable potential between a GND1 potential and a VDD1 potential and includes a PMOS transistor P3 and an NMOS transistor N3. In the PMOS transistor P3, its source is connected to the first power source line 13, and its drain is connected to the signal line 20. In the NMOS transistor N3, its source is connected to the first ground line 14, and its drain is connected to the signal line 20. Gates of the PMOS transistor P3 and the NMOS transistor N3 are commonly connected to a signal line 17 that is connected to an internal circuit (not shown) operated at the first power source voltage VDD1, and the output circuit 15 drives the signal line 20 on the basis of a control voltage supplied from the internal circuit.

On the other hand, the input circuit 25 is the circuit for receiving the signal through the signal line 20 from the output circuit 15 and includes a PMOS transistor P1 and an NMOS transistor N1. In the PMOS transistor P1, its source is connected to the second power source line 23, and its drain is connected to a signal line 27 that is connected to an internal circuit (not shown). On the other hand, in the NMOS transistor N1, its source is connected to the second ground line 24, and its drain is connected to the signal line 27. Gates of the PMOS transistor P1 and the NMOS transistor N1 are commonly connected to the signal line 20. The input circuit 25 drives the signal line 27 connected to an internal circuit (not shown), in response to the signal received through the signal line 20 from the output circuit 15.

For the sake of the protection against the ESD surge, main ESD protection elements 16 and 26, a protection diode pair D1 and a PMOS transistor P2 are arranged. The main ESD protection element 16 is connected between the first power source line 13 and the first ground line 14, and the main ESD protection element 26 is connected between the second power source line 23 and the second ground line 24. The protection diode pair D1 is arranged between the first ground line 14 and the second ground line 24 and functions as the ESD protection element. In this embodiment, the protection diode pair D1 is composed of two diodes connected in directions opposite to each other. In addition, the protection diode pair D1 has a function for electrically separating the first ground line 14 and the second ground line 24 at the time of the usual operation.

The main ESD protection elements 16 and 26 and the protection diode pair D1 configure a main protection circuit unit having the role that a discharging current flows through the main protection circuit, when the ESD surge is applied to the first power source pad 11, the first ground pad 12, the second power source pad 21 and the second ground pad 22. The main ESD protection elements 16 and 26 and the protection diode pair D1 are configured such that a large current can flow through the main ESD protection elements 16 and 26 and the protection diode pair D1.

On the other hand, the PMOS transistor P2 is a sub ESD protection element that is additionally inserted in order to relax a stress voltage applied to the NMOS transistor N1 in the input circuit 25. In the PMOS transistor P2, its source is connected to the signal line 20, its drain is connected to the second ground line 24, and its gate and its back gate are connected to the second power source line 23. By using this PMOS transistor P2, a sub protection circuit unit is configured for additionally carrying out the discharge when the ESD surge with positive polarity is applied to the first power source pad 11 between the first power source pad 11 and the second ground pad 22. This PMOS transistor P2 is configured such that a relatively small current $I_{2nd}$ flows as compared with the main ESD protection element 16 and the protection diode pair D1. As described later, the PMOS transistor P2 has a role that provides a route in which the micro current $I_{2nd}$ flows from the signal line 20 to the second ground line 24 when the ESD surge is applied to the first power source pad 11 and that consequently relaxes the stress voltage applied to the input circuit 25 by a voltage $I_{2nd} \times Rp$. Here, the Rp is the channel resistor Rp of the PMOS transistor P3.

An operation of the semiconductor device in this embodiment, especially, an operation of the PMOS transistor P2 configuring the sub protection circuit unit will be described below in detail.

At first, the operation at the time of the usual operation is described. At the time of the usual operation, the requirements for the PMOS transistor P2 is that the PMOS transistor P2 is turned off and its off leakage current is small. As described below in detail, the circuit configuration of FIG. 3 satisfies the foregoing requirements.

Figure 4:
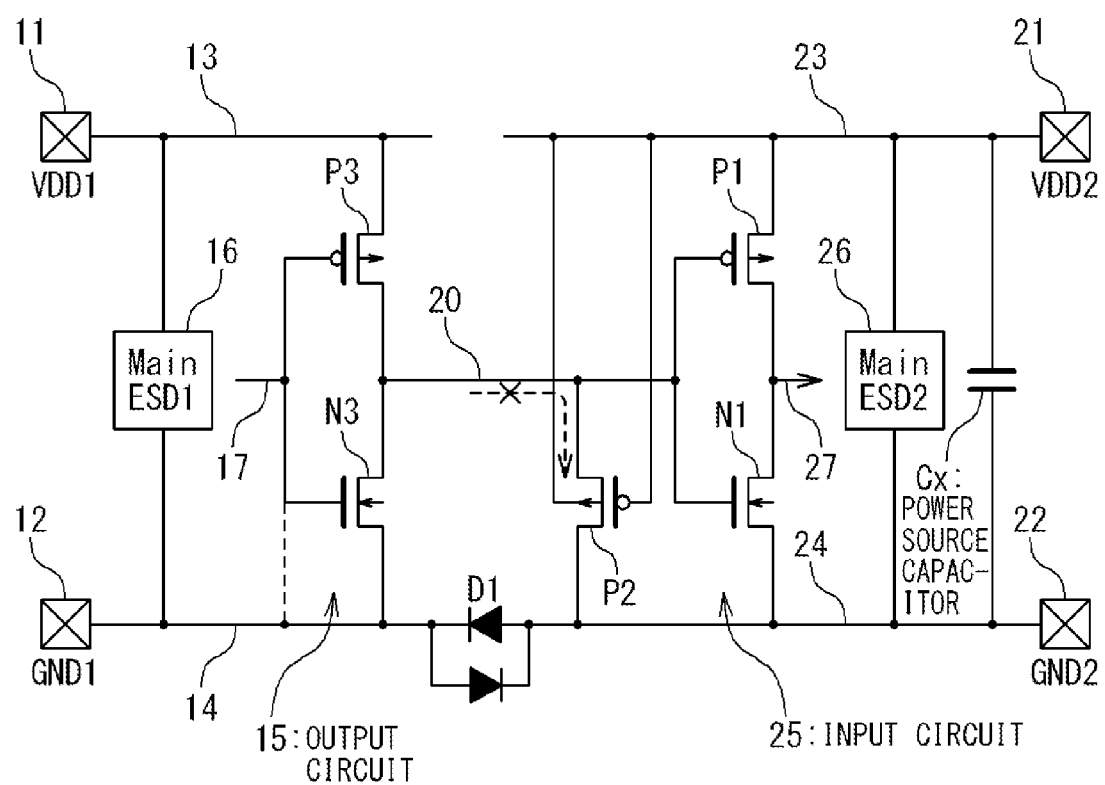
FIG. 4 is a circuit diagram showing an operation at a time of a usual operation of the semiconductor device in the first embodiment.

Specifically, as shown in FIG. 4, at the time of the usual operation, the second power source line 23 is fixed to the VDD2 potential, and the second ground line 24 is fixed to the GND potential, and a signal with an amplitude that has a maximum of the VDD1 potential and a minimum of the GND potential is supplied to the signal line 20. Here, as for the potential of the signal line 20, its maximum value may be equal to or lower than the power source voltage VDD2. If such a condition is satisfied, the PMOS transistor P2 is turned off.

At the time of the usual operation, attention should be paid to a fact that the potential of the back gate of the PMOS transistor P2 (the VDD2 potential) is higher than the potential of the source (the potential of the signal line 20). Thus, with the back gate effect, an absolute value of a threshold voltage of the PMOS transistor P2 is made high, which decreases the off leakage current of the PMOS transistor P2.

In addition, attention should be paid to a structure in which the connection of the back gate of the PMOS transistor P2 to the second power source line 23 (and not to the signal line 20) contributes to the signal transmission of a high speed. If the back gate of the PMOS transistor P2 is connected to the signal line 20, a well capacitance (for example, a junction capacitance between an N-well and a p-type substrate) of a well where the PMOS transistor P2 is formed is viewed from the signal line 20. Thus, the signal transmission of the high speed is interfered. In this embodiment, the back gate of the PMOS transistor P2 is connected to the second power source line 23 without being connected to the signal line 20. Hence, the well capacitance of the well where the PMOS transistor P2 is formed exists between the second power source line and the second ground line 24. Hence, the signal transmission of the high speed is not interfered.

Figure 5A:
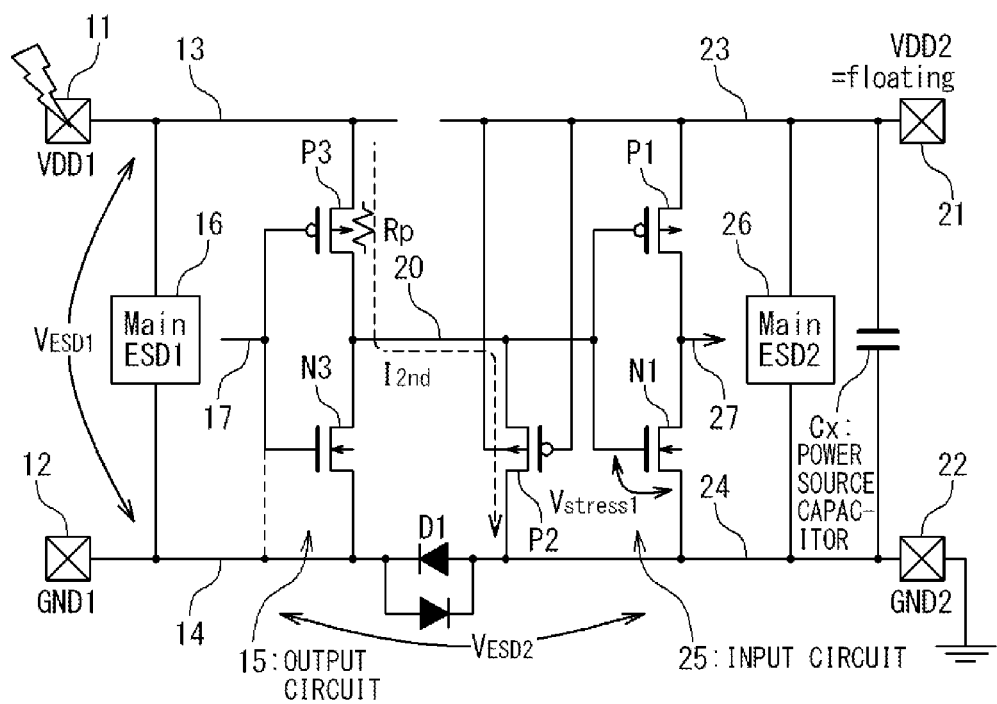
FIG. 5A is a circuit diagram showing an operation of the semiconductor device in the first embodiment when the ESD surge is applied.

On the other hand, FIG. 5A shows an operation when the ESD surge with positive polarity relative to the second ground pad 22 is applied to the first power source pad 11. In this case, attention should be paid to a fact that the power source voltage VDD2 is not applied to the second power source line 23, which is floating. In FIG. 5A, Cx is a power source capacitor provided as a parasitic capacitor or provided intentionally between the second power source line 23 and the second ground line 24. Until this power source capacitor Cx is charged, the potential of the second power source line 23 is not increased.

Also, attention should be paid to a fact that the gate of the PMOS transistor P3 in the output circuit 15 is floating. When the gate of the PMOS transistor P3 is floating, there is a case that the PMOS transistor P3 is turned on. As mentioned above, if the PMOS transistor P3 is turned on when the ESD surge is applied to the first power source pad 11, the stress voltage $V_{stress1}$ is applied between the gate and the source of the NMOS transistor N1 in the input circuit 25. The semiconductor device in this embodiment carries out the operation for protecting the NMOS transistor N1 from this stress voltage $V_{stress1}$. Thus, hereafter, the operation is described under an assumption that the PMOS transistor P3 is turned on.

When the ESD surge with positive polarity relative to the second ground pad 22 is applied to the first power source pad 11, a voltage $V_{ESD1}$ between the first power source line 13 and the first ground line 14 and a voltage $V_{ESD2}$ between the first ground line 14 and the second ground line 24 are increased, while the discharge is carried out in the main ESD protection element 16 and the protection diode pair D1. In association with these increases, the potential of the signal line 20 is also increased. While the potential of the signal line 20 is increased, the second power source line 23 is pulled down to the GND potential by the power source capacitance Cx. Thus, the potential of the signal line 20 becomes higher than the potential of the second power source line 23. That is, the source potential of the PMOS transistor P2 becomes higher than the gate potential. When the potential difference between the signal line 20 and the second power source line 23 exceeds a threshold voltage Vt of the PMOS transistor P2, the PMOS transistor P2 is turned on, thereby carrying out the MOS operation.

When the PMOS transistor P2 is turned on, a discharge route is formed from the first power source pad 11 through the first power source line 13, the PMOS transistor P3, the signal line 20 and the PMOS transistor P2 to the second ground line 24. When a discharge current $I_{2nd}$ flows through this discharge route, a voltage drop in the channel resistor Rp of the PMOS transistor P3 decreases the potential of the signal line 20. Then, the stress voltage $V_{stress1}$ applied between the source and the gate of the NMOS transistor N1 is decreased by a voltage $I_{2nd} \times Rp$. That is, the stress voltage $V_{stress1}$ is decreased to a voltage $V_{ESD1}+V_{ESD2}-I_{2nd} \times Rp$. This effectively protects the NMOS transistor N1 from being broken. Here, attention should be paid to a fact that only the small discharge current flows through the discharge route via the PMOS transistor P2 and that most of the discharge current caused by the application of the ESD surge flows through the discharge route via the main ESD protection element 16 and the protection diode pair D1.

In this operation, it is important that the PMOS transistor P2 carries out the usual MOS operation (without carrying out the parasitic bipolar operation) to consequently provide the discharge route. Since the PMOS transistor P2 is operated with the MOS operation, the PMOS transistor P2 is operated at the low voltage, and the effect of the protection of the NMOS transistor N1 is great. When the discharge route is provided by the parasitic bipolar operation such as the off transistor, the operational voltage becomes high such as about 4 V, and the relaxation effect of the stress voltage $V_{stress1}$ applied to the NMOS transistor N1 is not sufficient. On the other hand, in the configuration (FIG. 3) of this embodiment in which the PMOS transistor P2 carries out the MOS operation, the PMOS transistor P2 is operated at the low voltage. Hence, the relaxation effect of the stress voltage $V_{stress1}$ is great.

Figure 5B:
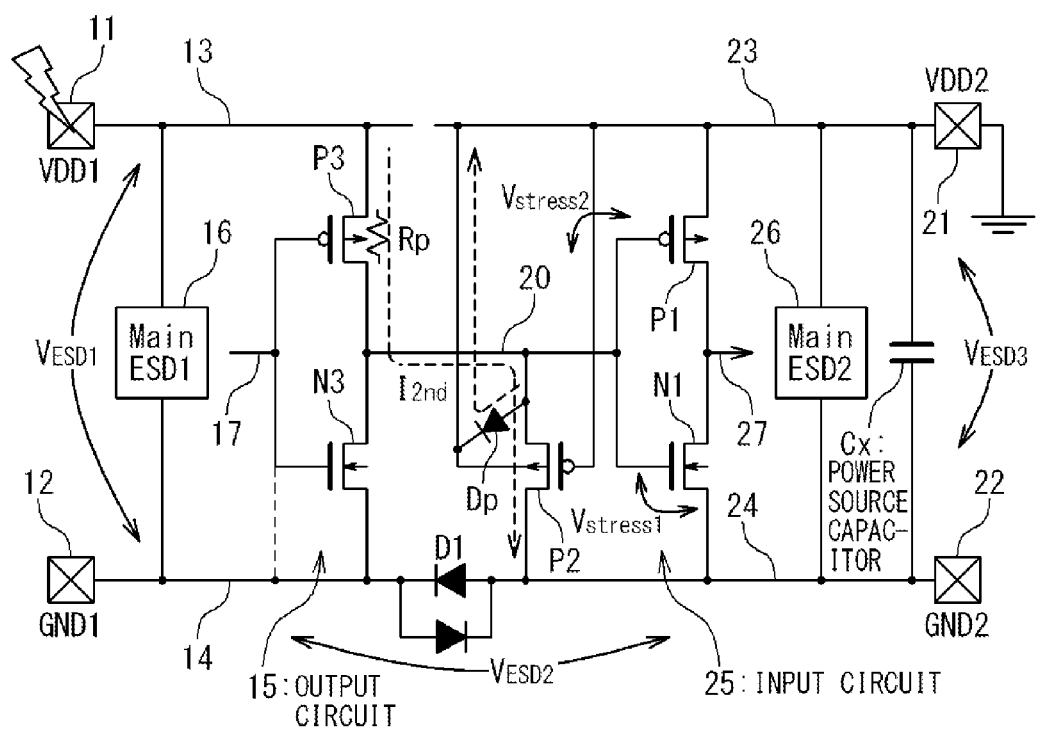
FIG. 5B is a circuit diagram showing the operation of the semiconductor device in the first embodiment when the ESD surge is applied.

On the other hand, FIG. 5B shows the operation when the ESD surge with positive polarity relative to the second power source pad 21 is applied to the first power source pad 11. Here, attention should be paid to a fact that the gate of the PMOS transistor P3 in the output circuit 15 is floating, similarly to the above case. When the gate of the PMOS transistor P3 is floating, there is a case that the PMOS transistor P3 is turned on. If the PMOS transistor P3 is turned on when the ESD surge is applied to the first power source pad 11, the stress voltage $V_{stress1}$ is applied between the gate and the source of the NMOS transistor N1 and the stress voltage $V_{stress2}$ is applied between the gate and the source of the PMOS transistor P1 in the input circuit 25. The semiconductor device in this embodiment carries out the operation for protecting the NMOS transistor N1 and the PMOS transistor P1 from these stress voltages $V_{stress1}$ and $V_{stress2}$.

In detail, when the ESD surge with positive polarity relative to the second power source pad 21 is applied to the first power source pad 11, the voltage $V_{ESD1}$ between the first power source line 13 and the first ground line 14, the voltage $V_{ESD2}$ between the first ground line 14 and the second ground line 24 and the voltage $V_{ESD3}$ between the second ground line 24 and the second power source line 23 are increased, while the discharge is carried out in the main ESD protection element 16, the protection diode pair D1 and the main ESD protection element 26. In association with these increases, the potential of the signal line 20 is also increased. At this time, since the second power source line 23 is kept at the GND potential, the potential of the signal line 20 becomes higher than the potential of the second power source line 23. That is, the source potential of the PMOS transistor P2 becomes higher than the gate potential. When the potential difference between the signal line 20 and the second power source line 23 exceeds the threshold voltage Vt of the PMOS transistor P2, the PMOS transistor P2 is turned on to carry out the MOS operation.

In addition, the PMOS transistor P2 functioning as the sub protection element also provides a discharge route of a parasitic diode Dp, which is formed between a source P-type diffusion layer of the PMOS transistor P2 and the N-well of the back gate. When the ESD surge with positive polarity relative to the second power source pad 21 is applied to the first power source pad 11, a forward bias is applied to the parasitic diode Dp. Thus, the parasitic diode Dp is turned on.

When the PMOS transistor P2 is turned on by the MOS operation, a discharge route is formed from the first power source pad 11 through the first power source line 13, the PMOS transistor P3, the signal line 20 and the PMOS transistor P2 to the second ground line 24. In addition, when the parasitic diode Dp of the PMOS transistor P2 is turned on, a discharge route is formed from the first power source pad 11 through the first power source line 13, the PMOS transistor P3, the signal line 20 and the PMOS transistor P2 to the second power source line 23. When the discharge current flows through these two discharge routes, the voltage drop in the channel resistor Rp of the PMOS transistor P3 effectively relaxes the stress voltage. The formation of the two discharge routes parallel to each other is preferable in increasing the relaxation effect of the stress. Specifically, when the discharge current $I_{2nd}$ flows through these two discharge routes, the voltage drop in channel resistor Rp of the PMOS transistor P3 decreases the potential of the signal line 20, and the stress voltage $V_{stress1}$ applied between the source and the drain of the NMOS transistor N1 and the stress voltage $V_{stress2}$ applied between the source and the drain of the PMOS transistor P1 are decreased by the voltage $I_{2nd} \times Rp$. That is, the stress voltage $V_{stress1}$ is decreased to the voltage $V_{ESD1}+V_{ESD2}-I_{2nd} \times Rp$, and the stress voltage $V_{stress2}$ is decreased to the voltage $V_{ESD1}+V_{ESD2}+V_{ESD3}-I_{2nd} \times Rp$. Consequently, the breakdowns of the NMOS transistor N1 and the PMOS transistor P1 are effectively protected.

In the above operation, attention should be paid to a fact that most of the discharge current caused by the application of the ESD surge flows through the discharge route via the main ESD protection element 16, the protection diode pair D1 and the main ESD protection element 26 and that only the relatively small discharge current flows through the discharge route via the PMOS transistor P2. The discharge route via the PMOS transistor P2 carries out the auxiliary role for relaxing the stress voltages $V_{stress1}$ and $V_{stress1}$ by using the voltage drops.

Here, in the circuit configuration in this embodiment shown in FIG. 3, if the clamp voltage of the PMOS transistor P2 functioning as the sub protection element is excessively low as compared with the clamp voltages of the main ESD protection element 16 and the protection diode pair D1, most of the discharge current flows into the PMOS transistor P2. Thus, there is a possibility that a problem occurs in which the PMOS transistor P2 is broken before the main ESD protection element 16 and the protection diode pair D1 are operated.

However, this problem is not actually important. The advancement of the miniaturization and the lower voltage of the power source voltage enable the thyristor type protection element to be used, which can reduce the voltage increase in the discharge to about 7 V or less. In addition, the advancement of the further miniaturization and the lower voltage of the power source voltage enable the lower voltage of the operational voltage of the main ESD protection element 16 to be expected. When the main ESD protection element 16 having the low clamp voltage of about 7 V is used, even if the PMOS transistor P2 in which the operational start voltage such as this embodiment is similar to the threshold voltage is used, the difference of the clamp voltage between the main ESD protection element 16 and the PMOS transistor P2 becomes small such as about 6 V. Thus, the problem of the breakdown of the PMOS transistor P2 does not occur.

Incidentally, the first embodiment indicates the circuit configuration in which the discharge current $I_{2nd}$ flows through the PMOS transistor P3. However, a different element that can function as a resistive element can be used instead of the PMOS transistor P3. In the operation of this embodiment, the PMOS transistor P3 merely functions as the resistive element. For example, in the output circuit 15, the resistive element may be used instead of the PMOS transistor P3. Also, a diode-connected PMOS transistor may be used. However, in order to reduce an electric power consumption by designing the output circuit 15 as a CMOS circuit configuration, the configuration in FIG. 3 is preferable in which the PMOS transistor P3 and the NMOS transistor N3 are used.

Second Embodiment

Figure 6:
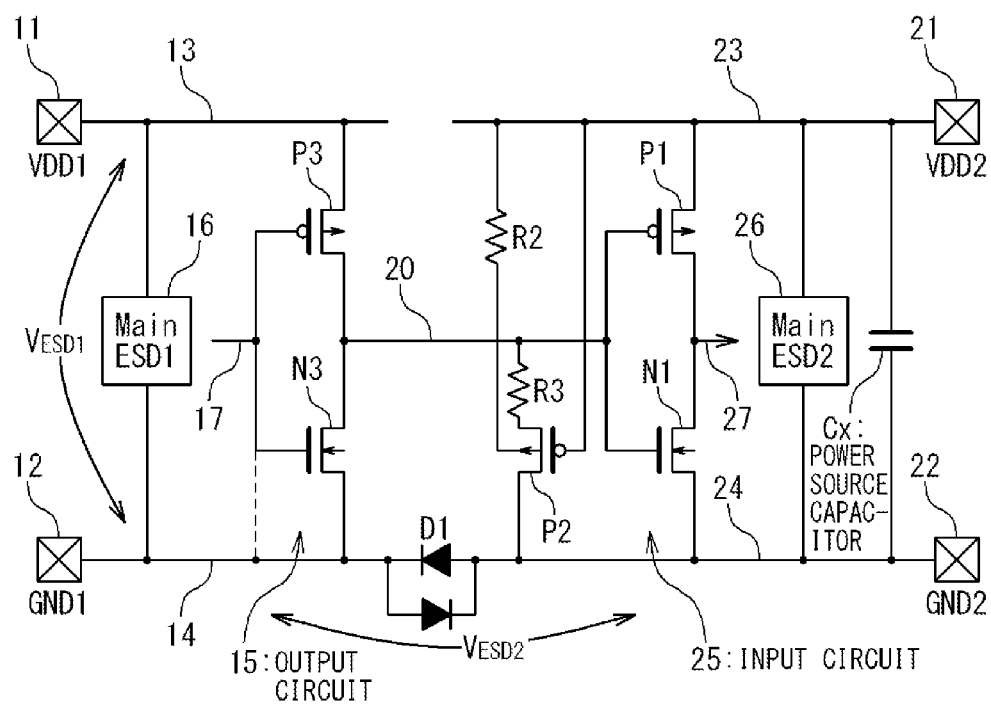
FIG. 6 is a circuit diagram showing a configuration of a semiconductor device in a second embodiment of the present invention.

FIG. 6 is a circuit diagram showing a configuration of a semiconductor device in the second embodiment of the present invention. In the circuit configuration in the first embodiment, when further speeding up is considered such as 10 GHz and the like, the parasitic capacitance of the main ESD protection element is required to be greatly decreased, and in association with the decrease, the size of the main ESD protection element is also required to be miniaturized. In this case, there is a possibility that an excessive discharge current flows into the PMOS transistor P2. When the excessive discharge current flows into the PMOS transistor P2, there is a possibility that the PMOS transistor P2 itself functioning as the sub protection element is broken. In order to deal with this, the second embodiment employs a method of preventing the excessive discharge current from flowing into the PMOS transistor P2.

Specifically, a resistive element R2 is inserted between the back gate of the PMOS transistor P2 and the second power source line 23, and a resistive element R3 is inserted in series with the PMOS transistor P2 between the signal line 20 and the second ground line 24. In FIG. 6, the resistive element R3 is inserted between the source of the PMOS transistor P2 and the signal line 20. However, the resistive element R3 may be inserted between the drain of the PMOS transistor P2 and the second ground line 24. The resistive elements R2 and R3 enable the value of the discharge current flowing through the PMOS transistor P2 to be intentionally limited, thereby preventing the PMOS transistor P2 from being broken. Incidentally, in FIG. 6, the two resistive elements, namely, the resistive elements R2 and R3 are inserted. However, only one of them may be inserted.

Third Embodiment

Figure 7A:
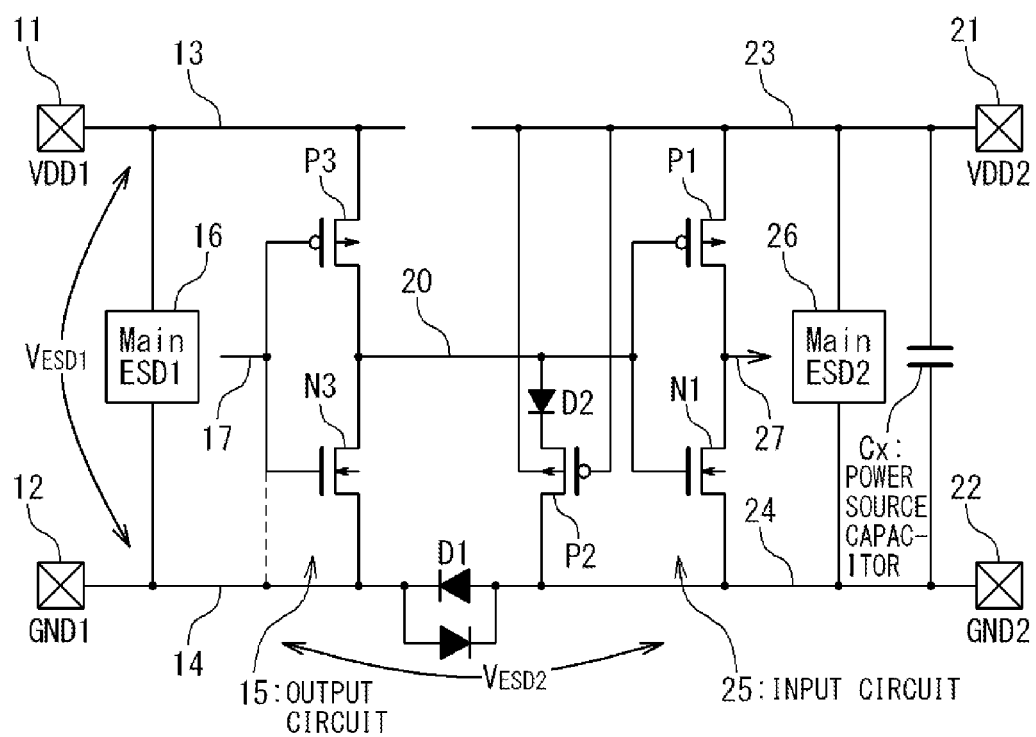
FIG. 7A is a circuit diagram showing a configuration of a semiconductor device in a third embodiment of the present invention.

FIG. 7A is a circuit diagram showing a configuration of a semiconductor device in the third embodiment of the present invention. In the third embodiment, a diode D2 is inserted in series with the PMOS transistor P2 between the signal line 20 and the second ground line 24. The diode D2 is inserted such that its forward direction is a direction which is oriented from the signal line 20 to the second ground line 24.

The diode D2 has a role for protecting the PMOS transistor P2 from being erroneously operated, when the potential of the signal line 20 becomes higher than the VDD2 potential at the time of the usual operation. There is a case that noise and the like cause the potential of the signal line 20 to unintentionally exceed the VDD2 potential. Also, there is a case that the VDD1 potential is intentionally set to be higher than the VDD2 potential. The configuration of the first embodiment has a possibility of an erroneous operation in which the PMOS transistor P2 is turned on even at the time of the usual operation, when the potential of the signal line 20 exceeds the sum of the VDD2 potential and the threshold voltage Vt of the PMOS transistor P2.

The diode D2 has a role for effectively preventing the foregoing erroneous operation of the PMOS transistor P2. In the configuration in FIG. 7A in which the diode D2 is inserted, the operational voltage of the PMOS transistor P2 is increased correspondingly to a forward voltage Vf of the diode D2. Thus, it becomes difficult for the erroneous operation to occur. In FIG. 7A, the number of the inserted diodes D2 is 1. However, since the N diodes D2 are inserted, the operational voltage of the PMOS transistor P2 can be increased by N×Vf. The number of the inserted diodes D2 may be adjusted in response to the desirable operational voltage.

Figure 7B:
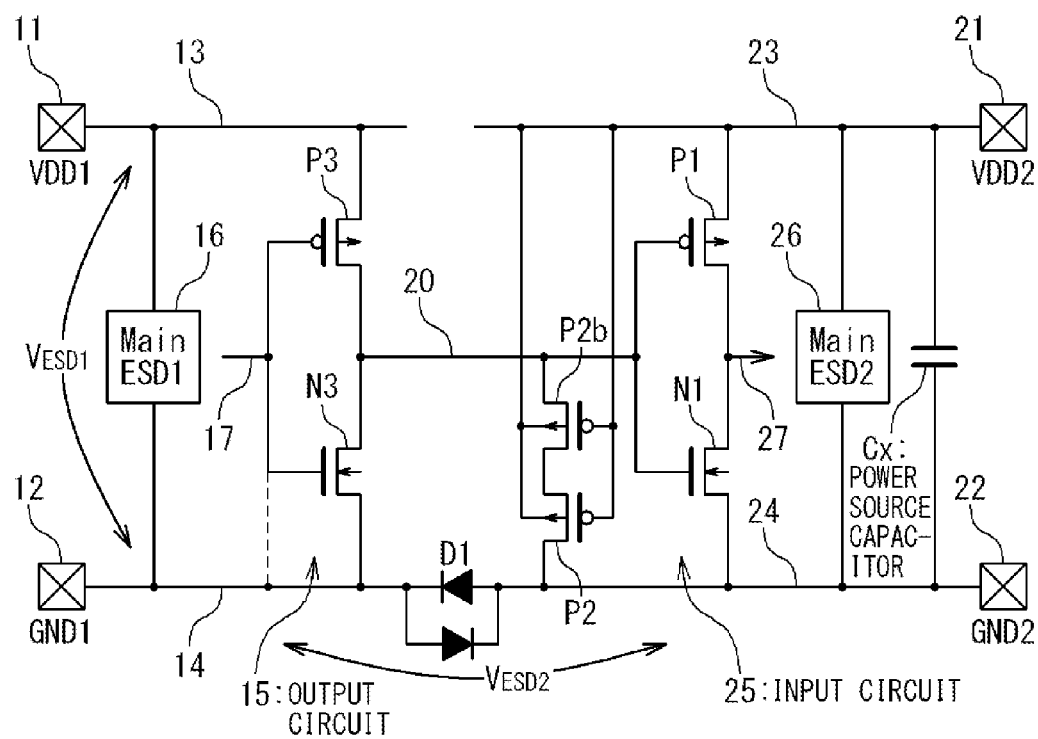
FIG. 7B is a circuit diagram showing another configuration of the semiconductor device in the third embodiment of the present invention.

Instead of the diode D2, one or a plurality of PMOS transistors may be inserted. FIG. 7B shows a configuration in which one PMOS transistor P2b is inserted in series with the PMOS transistor P2 between the signal line 20 and the second ground line 24. Typically, when the N PMOS transistors P2b are inserted, the potential of the signal line 20 at which the PMOS transistors P and P2b are operated become VDD2+(N+1)·Vt, which can effectively suppress the erroneous operation.

The above method of inserting the diode D2 and the PMOS transistor P2b can be used as the method of adjusting the voltage at which the PMOS transistor P2 is operated. Since the proper numbers of the diodes D2 and the PMOS transistors P2b are used to adjust the voltage at which the PMOS transistor P2 is operated, it is possible to prevent the erroneous operation of the PMOS transistor P2 and consequently attain a normal operation, even if the first power source voltage VDD1 is higher than the second power source voltage VDD2.

Fourth Embodiment

Figure 8:
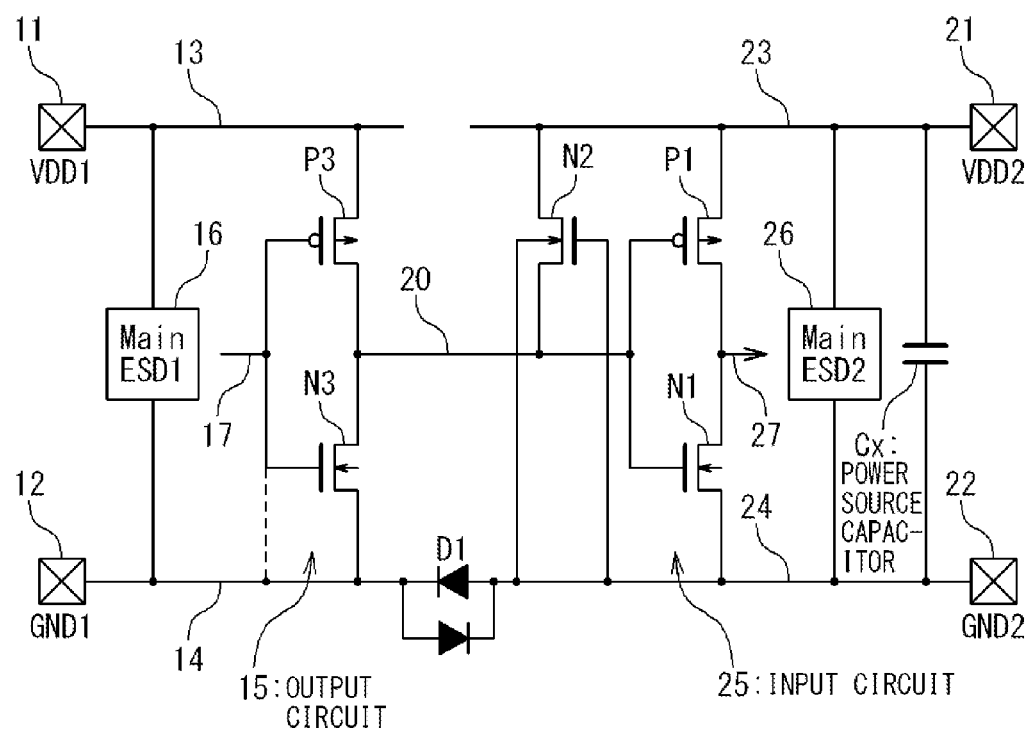
FIG. 8 is a circuit diagram showing a configuration of a semiconductor device in a fourth embodiment of the present invention.

FIG. 8 is a circuit diagram showing a configuration of a semiconductor device in the fourth embodiment of the present invention. In the fourth embodiment, the NMOS transistor N2 is used as a sub ESD protection element. In the NMOS transistor N2, its source is connected to the signal line 20, its drain is connected to the second power source line 23, and its back gate and its gate are connected to the second ground line 24. The other configurations are similar to those of the first embodiment.

In the configuration in this embodiment, when the ESD surge with positive polarity relative to the first power source pad 11 or first ground pad 12 is applied to the second power source pad 21 between the second power source pad 21 and the first power source pad 11 or first ground pad 12, it is possible to protect the NMOS transistor N1 and the PMOS transistor P1. An operation of the semiconductor device in this embodiment, especially, an operation of the NMOS transistor N2 configuring the sub protection circuit unit will be described below in detail.

Figure 9:
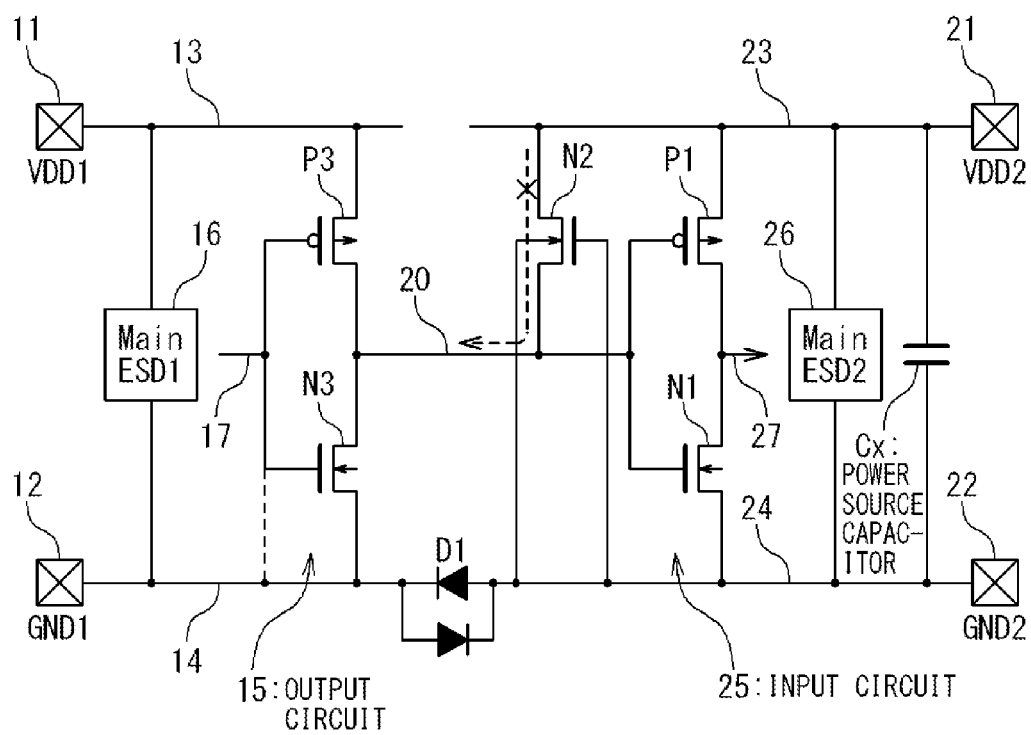
FIG. 9 is a circuit diagram showing an operation at a time of a usual operation of the semiconductor device in the fourth embodiment.

With reference to FIG. 9, at the time of the usual operation, the second power source line 23 is fixed to the VDD2 potential, and the second ground line 24 is fixed to the GND potential. Thus, the NMOS transistor N2 is turned off. Hence, at the time of the usual operation, the current does not flow through the NMOS transistor N2.

Figure 10A:
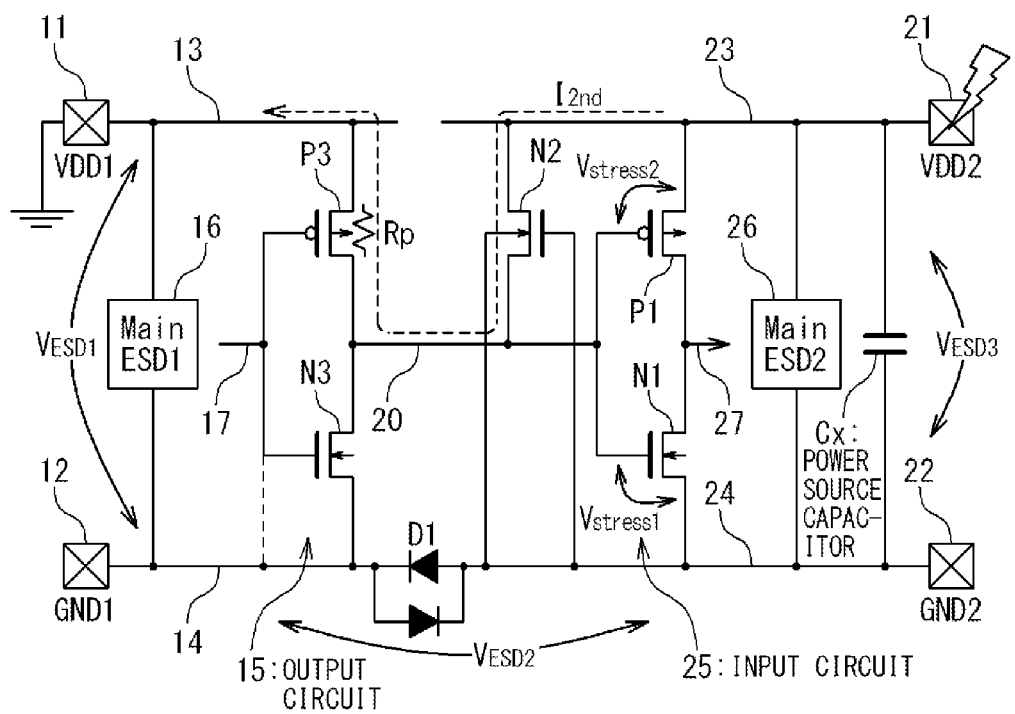
FIG. 10A is a circuit diagram showing an operation of the semiconductor device when the ESD surge is applied in the fourth embodiment.

On the other hand, as shown in FIG. 10A, when the ESD surge with positive polarity relative to the first power source pad 11 is applied to the second power source pad 21, the NMOS transistor N2 is operated to form an auxiliary discharge route, thereby relaxing the stress voltage $V_{stress1}$ applied between the source and the gate of the NMOS transistor N1 and the stress voltage $V_{stress2}$ applied between the source and the gate of the PMOS transistor P1. In detail, when the ESD surge with positive polarity relative to the first power source pad 11 is applied to the second power source pad 21, the discharge is carried out in the main ESD protection element 26, the protection diode pair D1 and the main ESD protection element 16. Then, the voltage $V_{ESD1}$ between the first power source line 13 and the first ground line 14 and the voltage $V_{ESD2}$ between the first ground line 14 and the second ground line 24 are increased. Consequently, the potential of the second ground line 24 becomes higher than the potential of the signal line 20. That is, the gate potential of the NMOS transistor N2 becomes higher than the source potential. When the potential difference between the signal line 20 and the second ground line 24 exceeds the threshold voltage Vt of the NMOS transistor N2, the NMOS transistor N2 is turned on, thereby carrying out the MOS operation.

When the NMOS transistor N2 is turned on, a discharge route is formed from the second power source pad 21 through the second power source line 23, the NMOS transistor N2, the signal line 20 and the PMOS transistor P3 to the first power source line 13. When the discharge current $I_{2nd}$ flows through this discharge route, a voltage is generated by the channel resistor Rp of the PMOS transistor P3 and the potential of the signal line 20 is increased. Then, the stress voltage $V_{stress1}$ applied between the source and the gate of the NMOS transistor N1 and the stress voltage $V_{stress2}$ applied between the source and the gate of the PMOS transistor P1 are decreased by the voltage $I_{2nd} \times Rp$.

That is, the stress voltage $V_{stress1}$ is decreased to the voltage $V_{ESD1}+V_{ESD2}-I_{2nd} \times Rp$, and the stress voltage $V_{stress2}$ is decreased to the voltage $V_{ESD1}+V_{ESD2}+V_{ESD3}-I_{2nd} \times Rp$. Consequently, the NMOS transistor N1 and the PMOS transistor P1 are protected.

Figure 10B:
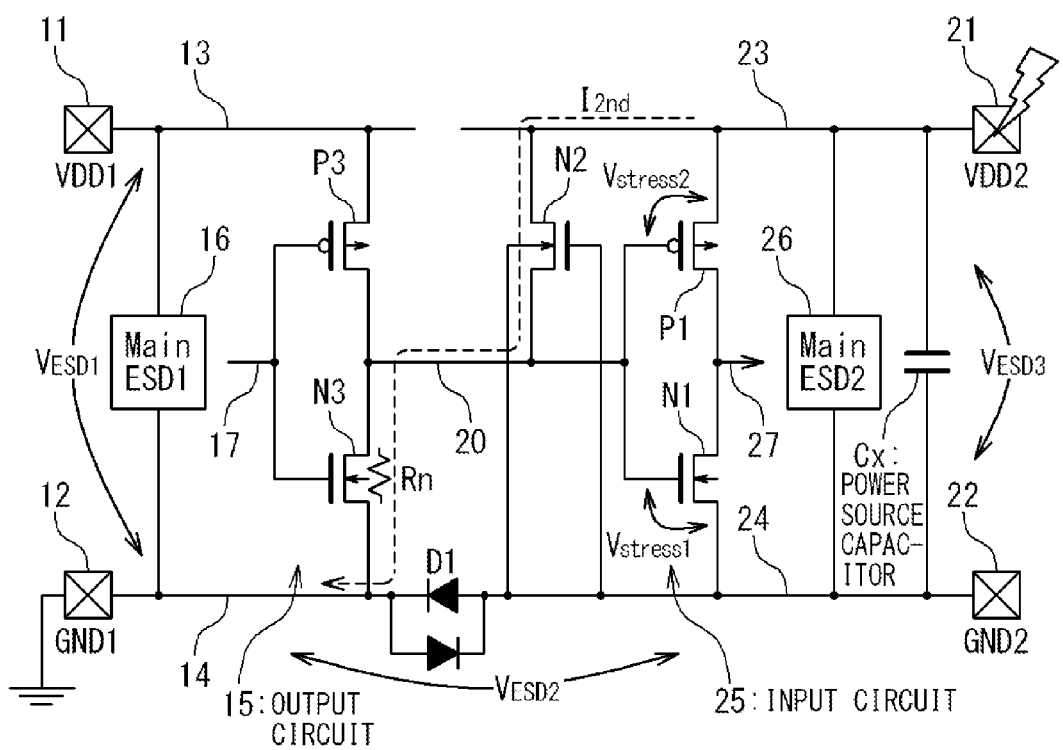
FIG. 10B is a circuit diagram showing the operation of the semiconductor device when the ESD surge is applied in the fourth embodiment.

Also, as shown in FIG. 10B, when the ESD surge with positive polarity relative to the first ground pad 12 is applied to the second power source pad 21, the NMOS transistor N2 is operated to form an auxiliary discharge route, thereby relaxing the stress voltage $V_{stress2}$ applied between the source and the gate of the PMOS transistor P1. In detail, when the ESD surge with positive polarity relative to the first ground pad 12 is applied to the second power source pad 21, the discharge is carried out in the main ESD protection element 26, the protection diode pair D1 and the main ESD protection element 16. Then, the voltage $V_{ESD2}$ between the first ground line 14 and the second ground line 24 and the voltage $V_{ESD3}$ between the second power source line 23 and the second ground line 24 are increased. Consequently, the potential of the second ground line 24 becomes higher than the potential of the signal line 20. That is, the gate potential of the NMOS transistor N2 becomes higher than the source potential. When the potential difference between the signal line 20 and the second ground line 24 exceeds the threshold voltage Vt of the NMOS transistor N2, the NMOS transistor N2 is turned on, thereby carrying out the MOS operation.

When the NMOS transistor N2 is turned on, a discharge route is formed from the second power source pad 21 through the second power source line 23, the NMOS transistor N2, the signal line 20 and the NMOS transistor N3 to the first power source line 13. When the discharge current $I_{2nd}$ flows through this discharge route, a voltage is generated by a channel resistor Rn of the NMOS transistor N3, and the potential of the signal line 20 is increased. Then, the stress voltage $V_{stress2}$ applied between the source and the gate of the PMOS transistor P1 is decreased by the voltage $I_{2nd} \times Rn$. That is, the stress voltage $V_{stress2}$ is decreased to the voltage $V_{ESD2}+V_{ESD3}-I_{2nd} \times Rn$. Consequently, the PMOS transistor P1 is protected.

Figure 11:
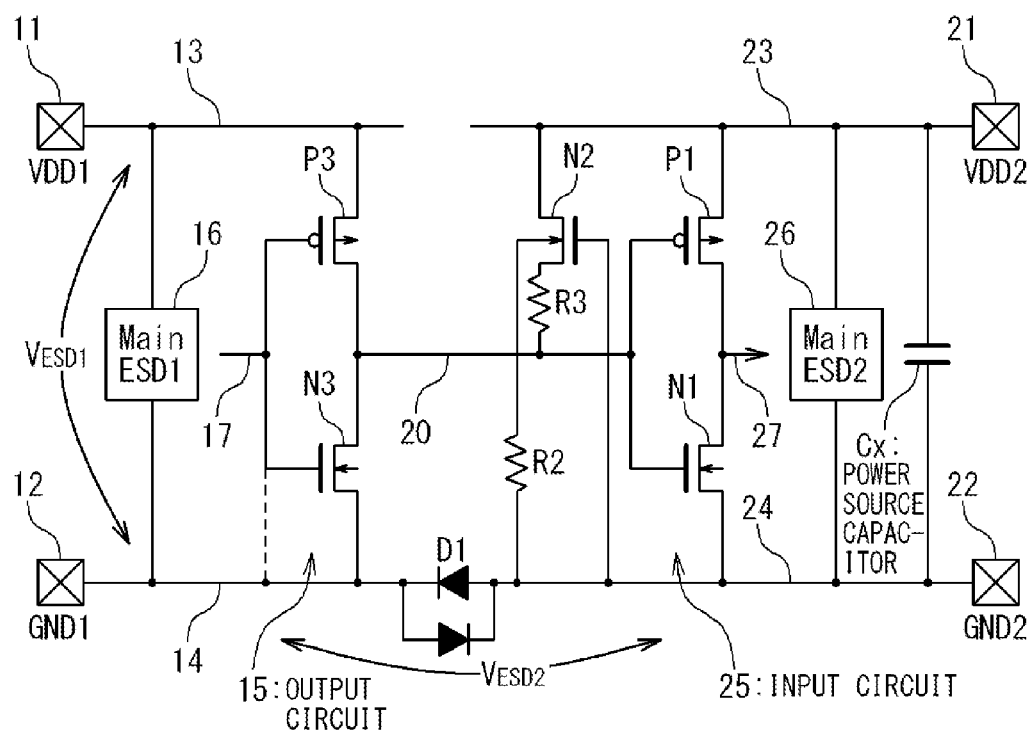
FIG. 11 is a circuit diagram showing another configuration of the semiconductor device in the fourth embodiment of the present invention.

Even in the fourth embodiment, similarly to the second embodiment, a resistive element may be arranged for preventing an excessive discharge current from flowing into the NMOS transistor N2. FIG. 11 is a circuit diagram showing a configuration of the semiconductor device having the foregoing feature. In the circuit configuration in FIG. 11, the resistive element R2 is inserted between the back gate of the NMOS transistor N2 and the second ground line 24, and the resistive element R3 is inserted in series with the NMOS transistor N2 between the signal line 20 and the second power source line 23. The resistive elements R2 and R3 enable the value of the discharge current flowing through the NMOS transistor N2 to be intentionally limited, thereby preventing the breakdown of the NMOS transistor N2. Incidentally, in FIG. 11, the two resistive elements, namely, the resistive elements R2 and R3 are inserted. However, only one of them may be inserted.

Figure 12A:
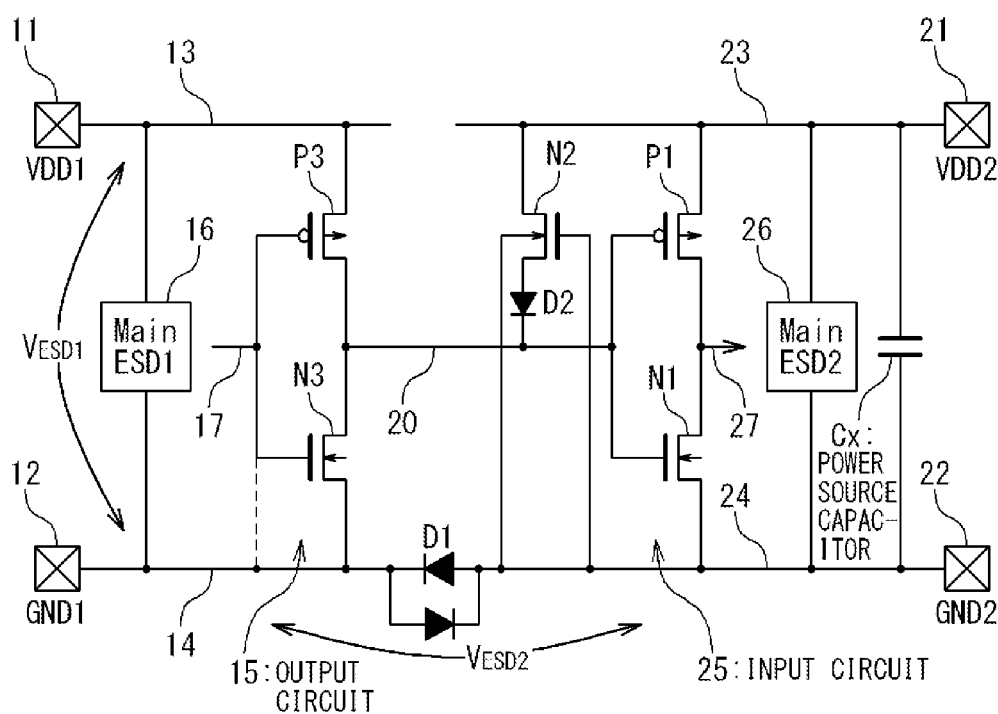
FIG. 12A is a circuit diagram showing still another configuration of the semiconductor device in the fourth embodiment of the present invention.
Figure 12B:
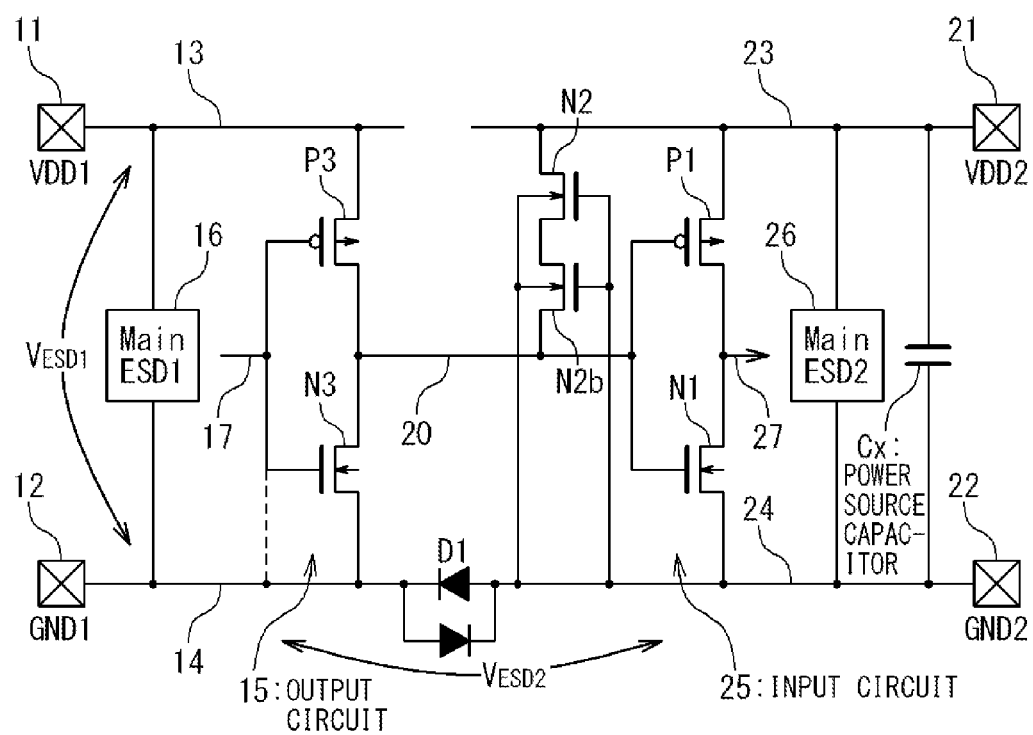
FIG. 12B is a circuit diagram showing still another configuration of the semiconductor device in the fourth embodiment of the present invention.

Also, similarly to the third embodiment, as shown in FIG. 12A, the diode D2 may be inserted in series with the NMOS transistor N2 between the signal line 20 and the second power source line 23. The diode D2 is inserted such that its forward direction is the direction which is oriented from the second power source line 23 to the signal line 20. The diode D2 has the role for protecting the NMOS transistor N2 from being erroneously operated at the time of the usual operation. One or a plurality of PMOS transistors may be inserted instead of the diode D2. FIG. 12B shows a configuration in which one NMOS transistor N2b is inserted in series with the NMOS transistor N2 between the signal line 20 and the second power source line 23.

Incidentally, in the above-mentioned embodiments, the circuit group operated at the power source voltage VDD1 and the circuit group operated at the power source voltage VDD2 may be monolithically integrated into a single chip or may be integrated into different chips. When they are monolithically integrated into the single chip, the circuits in each of the embodiments of the present invention are configured as SOC (System on Chip). When the circuit group operated at the power source voltage VDD1 and the circuit group operated at the power source voltage VDD2 are integrated into the different chips, the circuits in each of the embodiments of the present invention may be configured as SIP (System in Package).

Also, in the above descriptions, the various embodiments of the present invention are described. However, the present invention is not limited to the above-mentioned embodiments, and it is possible to carry out the various changes and modifications that are obvious for one skilled in the art. For example, although in the above-mentioned embodiments, the protection diode pair D1 is connected between the first ground line 14 and the second ground line 24, the first ground line 14 and the second ground line 24 may be merely connected. Even in this case, the discharge route is formed between the first ground line 14 and the second ground line 24. Even in the configuration in which the first ground line 14 and the second ground line 24 are merely connected, the voltage $V_{ESD2}$ is generated by a wiring resistor. Thus, the event similar to those of the above-mentioned embodiments is generated. Incidentally, when the first ground line 14 and the second ground line 24 are merely connected, only one of the first ground pad 12 and the second ground pad 22 can be arranged.

Moreover, attention should be paid to a fact that the above-described various embodiments can be executed by combining them if there is no confliction. For example, the configuration (FIG. 6) in which the resistive elements R2 and R3 are used to suppress the excessive current and the configuration in which the diode D2 (FIG. 7A) or the PMOS transistor P2b (FIG. 7B) is inserted may be executed at the same time. Also, FIGS. 8 to 12A and FIG. 12B show the circuit configuration that includes only the NMOS transistor N2 as the sub ESD protection element. However, it is possible to employ a circuit configuration that includes both of the NMOS transistor N2 and the PMOS transistor P2.

It is apparent that the present invention is not limited to the above embodiment, but may be modified and changed without departing from the scope and spirit of the invention.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
a first power source pad configured to be supplied with a first power source voltage;
a first power source line configured to be connected to said first power source pad;
a first ground line;
an output circuit configured to be operated using said first power source voltage;
a second power source pad configured to be supplied with a second power source voltage;
a second power source line configured to be connected to said second power source pad;
a second ground line;
a signal line configured to be connected to an output end of said output circuit;
an input circuit configured to be connected to said signal line at an input end to receive a signal from said output end, and be operated using said second power source voltage;
a main protection circuit unit configured to provide a main discharge route between said first power source pad and said first ground line, between said first ground line and said second ground line, and between said second ground line and said second power source pad; and
a sub protection circuit unit,
wherein said output circuit includes:
a circuit element configured to be arranged between said first power source line and said signal line and be able to function as a resistive element, and
wherein said sub protection circuit unit includes:
a first PMOS transistor configured to be connected to said signal line at a source, be connected to said second ground line at a drain, and be connected to said second power source line at a gate and a back gate, the first PMOS transistor being configured to be connected to the second power source line directly from at least the back gate, the back gate being connected to the second power source line without being connected to the signal line,
wherein when an electrostatic discharge (ESD) surge is applied at one of the power source pads,
the main discharge route is formed between said first power source pad and said first ground line, between said first ground line and said second ground line, and between said second ground line and said second power source pad,
a first stress voltage is applied between a source and a gate of a transistor of the input circuit, and
the first PMOS transistor is turned on, and
when the first PMOS transistor is turned on, at least one additional discharge route is formed from the first power source pad through the first power source line, the signal line, and the first PMOS transistor to the second ground line to reduce the first stress voltage to a second stress voltage applied between the source and the gate of the transistor of the input circuit and prevent a breakdown of the transistor of the input circuit, and
in a normal operation, a voltage value of the first power source voltage is lower than a voltage value of the second power source voltage and the potential of the back gate of the first PMOS transistor is higher than the potential of the source of the first PMOS transistor.

2. A semiconductor device comprising:
a first power source pad configured to be supplied with a first power source voltage;
a first power source line configured to be connected to said first power source pad;
a first ground line;
an output circuit configured to be operated using said first power source voltage;
a second power source pad configured to be supplied with a second power source voltage;
a second power source line configured to be connected to said second power source pad;
a second ground line;
a signal line configured to be connected to an output end of said output circuit;

an input circuit configured to be connected to said signal line at an input end to receive a signal from said output end, and be operated using said second power source voltage;

a main protection circuit unit configured to provide a main discharge route between said first power source pad and said first ground line, between said first ground line and said second ground line, and between said second ground line and said second power source pad, and a first stress voltage is applied between a source and a gate of a transistor of the input circuit; and a sub protection circuit unit, wherein said output circuit includes:

a circuit element configured to be arranged between said first power source line and said signal line and be able to function as a resistive element, and wherein said sub protection circuit unit includes:

a first PMOS transistor configured to be connected to said signal line at a source, be connected to said second ground line at a drain, and be connected to said second power source line at a gate and a back gate, the first PMOS transistor being configured to be connected to the second power source line from at least the back gate through a first resistor, the back gate being connected to the second power source line without being connected to the signal line, and a second resistor connected to said first PMOS transistor in series between said signal line and said second ground line, wherein when the first PMOS transistor is turned on, an additional discharge route is formed from the first power source pad through the first power source line, the signal line, and the first PMOS transistor to the second ground line to reduce the first stress voltage to a second stress voltage applied between the source and the gate of the transistor of the input circuit to prevent a breakdown of the transistor of the input circuit, and in a normal operation, a voltage value of the first power source voltage is lower than a voltage value of the second power source voltage and the potential of the back gate of the first PMOS transistor is higher than the potential of the source of the first PMOS transistor.

3. The semiconductor device according to claim 1, wherein said sub protection circuit unit further includes:

a diode element configured to be connected to said first PMOS transistor in series between said signal line and said second ground line such that a forward direction is a direction which is oriented from said signal line to said second ground line.

4. The semiconductor device according to claim 1, wherein said sub protection circuit unit further includes:

a second PMOS transistor configured to be connected to said first PMOS transistor in series between said signal line and said second ground line, wherein a gate and a back gate of said second PMOS transistor are connected to said second power source line.

5. The semiconductor device according to claim 1, wherein said circuit element includes:

a third PMOS transistor configured to be connected to said first power source line at a source and be connected to said signal line at a drain.

6. The semiconductor device according to claim 5, wherein said output circuit further includes:

a second NMOS transistor configured to be connected to said first ground line at a source and be connected to said signal line at a drain, wherein gates of said third PMOS transistor and said second NMOS transistor are commonly connected to a first internal circuit, wherein said input circuit further includes:

a fourth PMOS transistor configured to be connected to said second power source line at a source and be connected to said signal line at a gate, and a first NMOS transistor configured to be connected to said second ground line at a source and be connected to said signal line at a gate, wherein drains of said first NMOS transistor and said fourth PMOS transistor are commonly connected to a second internal circuit.

7. The semiconductor device according to claim 1, wherein said main protection circuit unit includes:

a first ESD protection element configured to be connected to said first power source line and said first ground line, and a second ESD protection element configured to be connected to said first ground line and said second ground line.

8. The semiconductor device according to claim 7, wherein said first ESD protection element and said second ESD protection element are configured such that a current which can flow through each of said first ESD protection element and said second ESD protection element is larger than a current which can flow through said first PMOS transistor.

9. The semiconductor device according to claim 1, wherein the source of the first PMOS transistor is directly connected to the signal line.

10. The semiconductor device according to claim 1, wherein the signal line is directly connected to the output end of the output circuit.

11. A semiconductor device comprising:

a first power source pad configured to be supplied with a first power source voltage;

a first power source line configured to be connected to said first power source pad;

a first ground line;

an output circuit configured to be operated using said first power source voltage;

a second power source pad configured to be supplied with a second power source voltage;

a second power source line configured to be connected to said second power source pad;

a second ground line;

a signal line configured to be connected to an output end of said output circuit;

an input circuit configured to be connected to said signal line at an input end to receive a signal from said output end, and be operated using said second power source voltage;

a main protection circuit unit configured to provide a main discharge route between said first power source pad and said first ground line, between said first ground line and said second ground line, and between said second ground line and said second power source pad; and a sub protection circuit unit, wherein said output circuit includes:

a circuit element configured to be arranged between said first power source line and said signal line and be able to function as a first resistive element, and wherein said sub protection circuit unit includes:

a first NMOS transistor configured to be connected to said signal line at a source, be connected to said second power source line at a drain and be connected to said second ground line at a gate and a back gate, and a sub protection circuit element connected to the first NMOS transistor in series between the signal line and the second power source line, the sub protection circuit element being connected between the signal line and the first NMOS transistor, when an electrostatic discharge (ESD) surge is applied at one of the power source pads, the main discharge route is formed between said first power source pad and said first ground line, between said first ground line and said second ground line, and between said second ground line and said second power source pad, a first stress voltage is applied between a source and a gate of a transistor of the input circuit, and the first NMOS transistor is turned on, and when the first NMOS transistor is turned on, at least one additional discharge route formed from the second power source pad through the second power source line, and successively through the first NMOS transistor, the sub protection circuit element, and the signal line to the first power source line to reduce the first stress voltage to a second stress voltage applied between the source and the gate of the transistor of the input circuit and prevent a breakdown of the transistor of the input circuit, and in a normal operation, a voltage value of the first power source voltage is lower than a voltage value of the second power source voltage and the potential of the back gate of the first NMOS transistor is lower than the potential of the drain of the first NMOS transistor.

12. The semiconductor device according to claim 11, wherein said sub protection circuit unit further includes a second resistive element connected between said back gate of said first NMOS transistor and said second ground line, and wherein the sub protection circuit element comprises a third resistive element connected to said first NMOS transistor in series between said signal line and said second power source line.

13. The semiconductor device according to claim 11, wherein said sub protection circuit unit includes:

a diode element configured to be connected to said first NMOS transistor in series between said signal line and said second power source line such that a forward direction is a direction which is oriented from said second power source line to said signal line.

14. The semiconductor device according to claim 11, wherein said sub protection circuit element includes:

a second NMOS transistor configured to be connected to said first NMOS transistor in series between said signal line and said second power source line, wherein a gate and a back gate of said second NMOS transistor are connected to said second ground line.

15. The semiconductor device according to claim 11, wherein said circuit element includes:

a second PMOS transistor configured to be connected to said first power source line at a source and be connected to said signal line at a drain.

16. The semiconductor device according to claim 15, wherein said output circuit further includes:

a third NMOS transistor configured to be connected to said first ground line at a source and be connected to said signal line at a drain, wherein gates of said third NMOS transistor and said second PMOS transistor are commonly connected to a first internal circuit, wherein said input circuit further includes:

a fourth NMOS transistor configured to be connected to said second ground line at a source and be connected to said signal line at a gate, and a first PMOS transistor configured to be connected to said second power source line at a source and be connected to said signal line at a gate, wherein drains of said first PMOS transistor and said fourth NMOS transistor are commonly connected to a second internal circuit.

17. The semiconductor device according to claim 11, wherein said main protection circuit unit includes:

a first ESD protection element configured to be connected to said first power source line and said first ground line, a second ESD protection element configured to be connected to said first ground line and said second ground line, and a third ESD protection element configured to be connected to said second ground line and said second power source line.

18. The semiconductor device according to claim 17, wherein said first ESD protection element, said second ESD protection element and said third ESD protection element are configured such that a current which can flow through each of said first ESD protection element, said second ESD protection element and said third ESD protection element is larger than a current which can flow through said first NMOS transistor.

19. The semiconductor device according to claim 11, wherein the sub protection circuit unit is constructed and arranged to provide a discharge route from the second power line to the signal line for an ESD surge applied at the second power source pad.

20. A semiconductor device comprising:

a first power source pad configured to be supplied with a first power source voltage;

a first power source line configured to be connected to said first power source pad;

a first ground line;

an output circuit configured to be operated using said first power source voltage;

a second power source pad configured to be supplied with a second power source voltage;

a second power source line configured to be connected to said second power source pad;

a second ground line;

a signal line configured to be connected to an output end of said output circuit;

an input circuit configured to be connected to said signal line at an input end to receive a signal from said output end, and be operated using said second power source voltage;

a main protection circuit unit configured to provide a main discharge route between said first power source pad and said first ground line, between said first ground line and said second ground line, and between said second ground line and said second power source pad; and a sub protection circuit unit, wherein said output circuit includes:

a circuit element configured to be arranged between said first power source line and said signal line and be able to function as a resistive element, and wherein said sub protection circuit unit includes:

a first PMOS transistor configured to be connected to said signal line at a source, be connected to said second ground line at a drain, and be connected to said second power source line at a gate and a back gate, the first PMOS transistor being configured to be connected to the second power source line directly from at least the back gate, the back gate being connected to the second power source line without being connected to the signal line, wherein the main protection circuit unit is constructed and arranged to provide the main discharge route through which a first discharge current flows when an electrostatic discharge (ESD) surge is applied at one of the power source pads, and the sub protection circuit unit is constructed and arranged to provide at least one additional discharge route from the signal line to the second ground line through which a second discharge current flows when the ESD surge is applied, the second discharge current being less than the first current, the additional discharge route reducing a first stress voltage applied between a source and a gate of a transistor of the input circuit to a second stress voltage applied between the source and the gate of the transistor of the input circuit, and in a normal operation, a voltage value of the first power source voltage is lower than a voltage value of the second power source voltage and the potential of the back gate of the first PMOS transistor is higher than the potential of the source of the first PMOS transistor.

* * * * *